(12) United States Patent
Lempel et al.

(10) Patent No.: US 11,803,693 B2
(45) Date of Patent: Oct. 31, 2023

(54) TEXT COMPRESSION WITH PREDICTED CONTINUATIONS

(71) Applicant: Microsoft Technology Licensing, LLC, Redmond, WA (US)

(72) Inventors: Ronny Lempel, Redmond, WA (US); Chenyan Xiong, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 313 days.

(21) Appl. No.: 17/351,531

(22) Filed: Jun. 18, 2021

(65) Prior Publication Data
US 2022/0405461 A1    Dec. 22, 2022

(51) Int. Cl.
*H03M 7/00* (2006.01)
*G06F 40/126* (2020.01)
*G06F 40/279* (2020.01)
*H03M 7/30* (2006.01)

(52) U.S. Cl.
CPC .......... *G06F 40/126* (2020.01); *G06F 40/279* (2020.01); *H03M 7/3071* (2013.01); *H03M 7/6011* (2013.01)

(58) Field of Classification Search
CPC .... G06F 40/126; G06F 40/279; G06F 40/274; H03M 7/3071; H03M 7/6011; H03M 7/3073; H03M 7/3084
USPC ........................................................ 341/107
See application file for complete search history.

(56) References Cited

U.S. PATENT DOCUMENTS

| 5,951,623 | A | 9/1999 | Reynar et al. |
| 5,991,515 | A | 11/1999 | Wong et al. |
| 6,008,743 | A | 12/1999 | Jaquette |
| 6,172,987 | B1 | 1/2001 | Razazian et al. |
| 6,392,567 | B2 * | 5/2002 | Satoh ................. H03M 7/3086 341/51 |
| 7,417,568 | B2 | 8/2008 | Fallon et al. |

(Continued)

OTHER PUBLICATIONS

Fogel, Karl, "rants.org", Retrieved from: https://www.rants.org/2020/06/, Jun. 24, 2020, 3 Pages.

(Continued)

*Primary Examiner* — Jean B Jeanglaude
(74) *Attorney, Agent, or Firm* — Alleman Hall Creasman & Tuttle LLP

(57) ABSTRACT

A method for text compression comprises recognizing a prefix string of one or more text characters preceding a target string of a plurality of text characters to be compressed. The prefix string is provided to a natural language generation (NLG) model configured to output one or more predicted continuations each having an associated rank. If the one or more predicted continuations include a matching predicted continuation relative to the next one or more text characters of the target string, the next one or more text characters are compressed as an NLG-type compressed representation. If no predicted continuations match the next one or more text characters of the target string, a longest matching entry in a compression dictionary is identified. The next one or more text characters of the target string are compressed as a dictionary-type compressed representation that includes the dictionary index value of the longest matching entry.

20 Claims, 8 Drawing Sheets

(56) References Cited

U.S. PATENT DOCUMENTS

| | | | | |
|---|---|---|---|---|
| 8,929,402 | B1* | 1/2015 | Hughes | H03M 7/3084 |
| | | | | 370/477 |
| 9,363,309 | B2* | 6/2016 | Hughes | H03M 7/3084 |
| 10,402,493 | B2* | 9/2019 | Spencer | G06F 40/274 |
| 10,528,567 | B2* | 1/2020 | Teerlink | G06F 16/283 |
| 2001/0026231 | A1* | 10/2001 | Satoh | H03M 7/3086 |
| | | | | 341/87 |
| 2004/0044519 | A1 | 3/2004 | Polanyi et al. | |
| 2007/0233477 | A1 | 10/2007 | Halowani et al. | |
| 2014/0297267 | A1* | 10/2014 | Spencer | G06F 3/04886 |
| | | | | 704/9 |
| 2016/0328377 | A1* | 11/2016 | Spencer | G06F 3/04886 |

OTHER PUBLICATIONS

Galanis, et al., "An Extractive Supervised Two-Stage Method for Sentence Compression", In Proceedings of Human Language Technologies: Annual Conference of the North American Chapter of the Association for Computational Linguistics, Jun. 2010, pp. 885-893.
"Compressing text using AI by sending only prediction rank of next word", Retrieved From: https://ai.stackexchange.com/questions/23263/compressing-text-using-ai-by-sending-only-prediction-rank-of-next-word, Apr. 10, 2021, 3 Pages.
"LZ77 and LZ78", Retrieved From: https://en.wikipedia.org/wiki/LZ77_and_LZ78, May 16, 2021, pp. 1-6.
Brova, George, "Text Compression with Neural Networks", Retrieved From: https://gbrova.github.io/text-compression-neural-nets/, Oct. 30, 2020, 9 Pages.
Fenwick, Peter, "Symbol Ranking Text Compression with Shannon Recodings Fenwick, Peter", In Journal of Universal Computer Science, vol. 3, Issue 2, Feb. 28, 1997, pp. 70-85.
Nelson, "Introduction to Data Compression", In Publication of Data Compression Book, Chapter 1, Jan. 1, 1991, pp. 3-27.
"International Search Report and Written Opinion Issued in PCT Application No. PCT/US22/028889", dated Aug. 25, 2022, 12 Pages.

* cited by examiner

TEXT COMPRESSION WITH PREDICTED CONTINUATIONS

BACKGROUND

A computing device may encode text characters using a plurality of bits of computer data per character. Text compression techniques can reduce the amount of computer data used to represent digital text of arbitrary length. Compression techniques often take advantage of redundancy in the text to be compressed.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A method for text compression comprises recognizing a prefix string of one or more text characters preceding a target string of a plurality of text characters to be compressed. The prefix string is provided to a natural language generation (NLG) model configured to output one or more predicted continuations each having an associated rank. If the one or more predicted continuations include a matching predicted continuation relative to the next one or more text characters of the target string, the next one or more text characters are compressed as an NLG-type compressed representation. If no predicted continuations match the next one or more text characters of the target string, a longest matching entry in a compression dictionary is identified. The next one or more text characters of the target string are compressed as a dictionary-type compressed representation that includes the dictionary index value of the longest matching entry.

DETAILED DESCRIPTION

Text characters may be digitally encoded using computer data in a variety of suitable ways. In many cases, each individual text character of a target string may be represented using a plurality of bits of data according to a selected text encoding system—e.g., American Standard Code for Information Interchange (ASCII) and/or a suitable Unicode transformation format. However, many passages of text include some degree of repetition of text characters, characters strings, whole words, and/or whole sentences, and these repeated segments are typically all encoded separately. This means that the amount of computer storage space used to store, and/or the amount of network bandwidth used to transmit, relatively large passages of uncompressed text (e.g., thousands or millions of words) can become significantly higher than would be the case if the text was compressed to take advantage of redundancy—e.g., based on repeated words or character strings.

Figure 1:
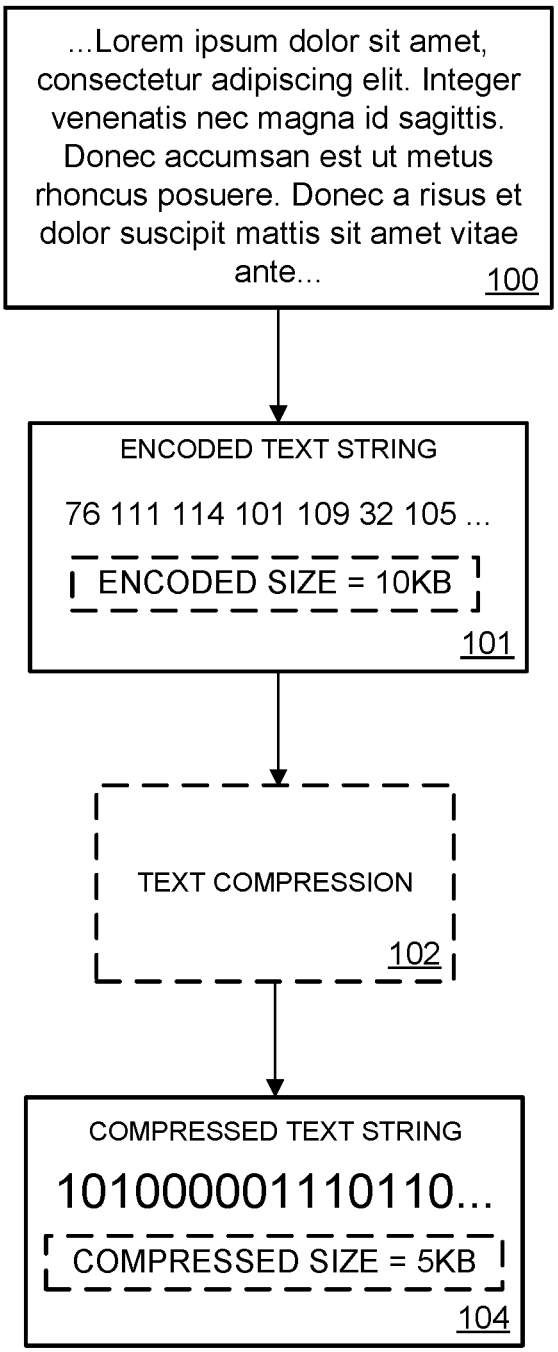
FIG. 1 schematically illustrates compression of an example text string.

To this end, various text compression techniques can be used to reduce the amount of computer data required to represent a particular text string of arbitrary length. This process is schematically illustrated in FIG. 1, showing an example text string 100. It will be understood that text string 100 is intended as placeholder text used only for the sake of illustration, and should not be construed as having any particular meaning in any language.

Furthermore, though the present disclosure primarily focuses on text characters of the English alphabet, it will be understood that this is not limiting. Rather, the techniques described herein may be applied to text strings including any suitable text characters, supported by any suitable text encoding standards. The present disclosure also primarily focuses on scenarios in which the text to be compressed is divided into a plurality of whole words—e.g., the text may represent human-readable writings in a human language. It will be understood, however, that the techniques described herein may in some cases be applied to continuous text strings that are not divided into separate words.

Text string 100 is also shown as an encoded text string 101, where individual text characters of the text string are encoded using ASCII character codes. As shown, in the example scenario of FIG. 1, the encoded text string 101 has a size of 10 KB (it will be understood that this encoded size corresponds to significantly more text characters of text string 100 than are shown in FIG. 1). Encoded text string 101 is compressed via a text compression process 102 to give a compressed text string 104. The text compression process may losslessly reduce the amount of computer data used by a computing device to store and/or transmit text string 100—e.g., compressed text string 104 may later be decompressed to recreate the original text string with no loss of information even though compressed text string 104 uses fewer bits than uncompressed text string 100. Specifically, as shown, the compressed text string has a compressed size of 5 KB, meaning the text compression process in this non-limiting example has a compression ratio of 2:1. It will be understood that the compression ratio of the text compression process may vary from one implementation to another—e.g., due to the specific compression processes used and the degree of redundancy in the uncompressed text.

Text compression techniques may utilize language prediction models. Such techniques may involve, for each token (e.g., word), outputting a probabilistic distribution over a large number of potential vocabulary words. Arithmetic coding techniques may be used to encode the correct token by encoding a number within its probability range. For unexpected words—e.g., those to which the prediction model assigns low probabilities—this encoding may require many bits. Furthermore, the treatment for out-of-vocabulary tokens (e.g., those that the language prediction model cannot predict at all), may require resorting to less optimal coding schemes.

Accordingly, the present disclosure describes techniques for text compression that leverage predicted continuations output by a natural language generation (NLG) model, in combination with a compression dictionary that maintains index values representing various character strings in the compressed text. In general, the present disclosure focuses on compression of an overall "text string" that includes a plurality of text characters for compression (e.g., text string 100). Any text characters of this overall text string that have not yet been compressed are referred to as a "target string". At each step of the compression process, a "prefix string" of any text characters preceding the target string (e.g., text characters that have already been compressed) may be provided to an NLG model configured to output predicted continuations to the prefix string, where each predicted continuation has an associated rank. If the one or more predicted continuations output by the NLG model include a matching predicted continuation relative to the next one or more text characters of the target string, the associated rank of the matching predicted continuation is encoded as part of a NLG-type compressed representation of the next one or more text characters of the target string. Such encoding may use any suitable prefix-free encoding system, as will be described in more detail below.

Alternatively, if no predicted continuations match the next one or more text characters of the target string, a longest matching entry in a compression dictionary is identified that is consistent with the next one or more text characters of the target string, where the compression dictionary includes a plurality of entries each having associated dictionary index values. An associated dictionary index value of the longest matching entry is encoded as part of a dictionary-type compressed representation of the next one or more text characters of the target string. In this manner, the overall text string may be iteratively compressed as a plurality of different compressed representations based on 1) predictions output by an NLG model when such predictions are readily available, or 2) when such predictions are not readily available, dictionary entries that have been iteratively added to the compression dictionary based on previous characters in the text string. It will be understood that new entries may be iteratively added to the dictionary based on any text characters compressed using the techniques described herein, regardless of whether such text characters are compressed using the NLG model or the compression dictionary.

In this manner, the techniques described herein increase the compression efficiency as compared to other text compression techniques. Specifically, compressing text characters as either NLG-type compressed representations, or dictionary-type compressed representations, depending on whether any predicted continuations output by the NLG model match the next one or more characters of the target string, reduces the overall amount of computer data used to represent the text string. This has the technical effect of reducing the amount of computer storage space required to store the text string, and/or reducing the amount of network bandwidth required to transmit the text string. This performance improvement is equivalent to having a computer storage device with more capacity, and/or a faster network connection.

Figure 2:
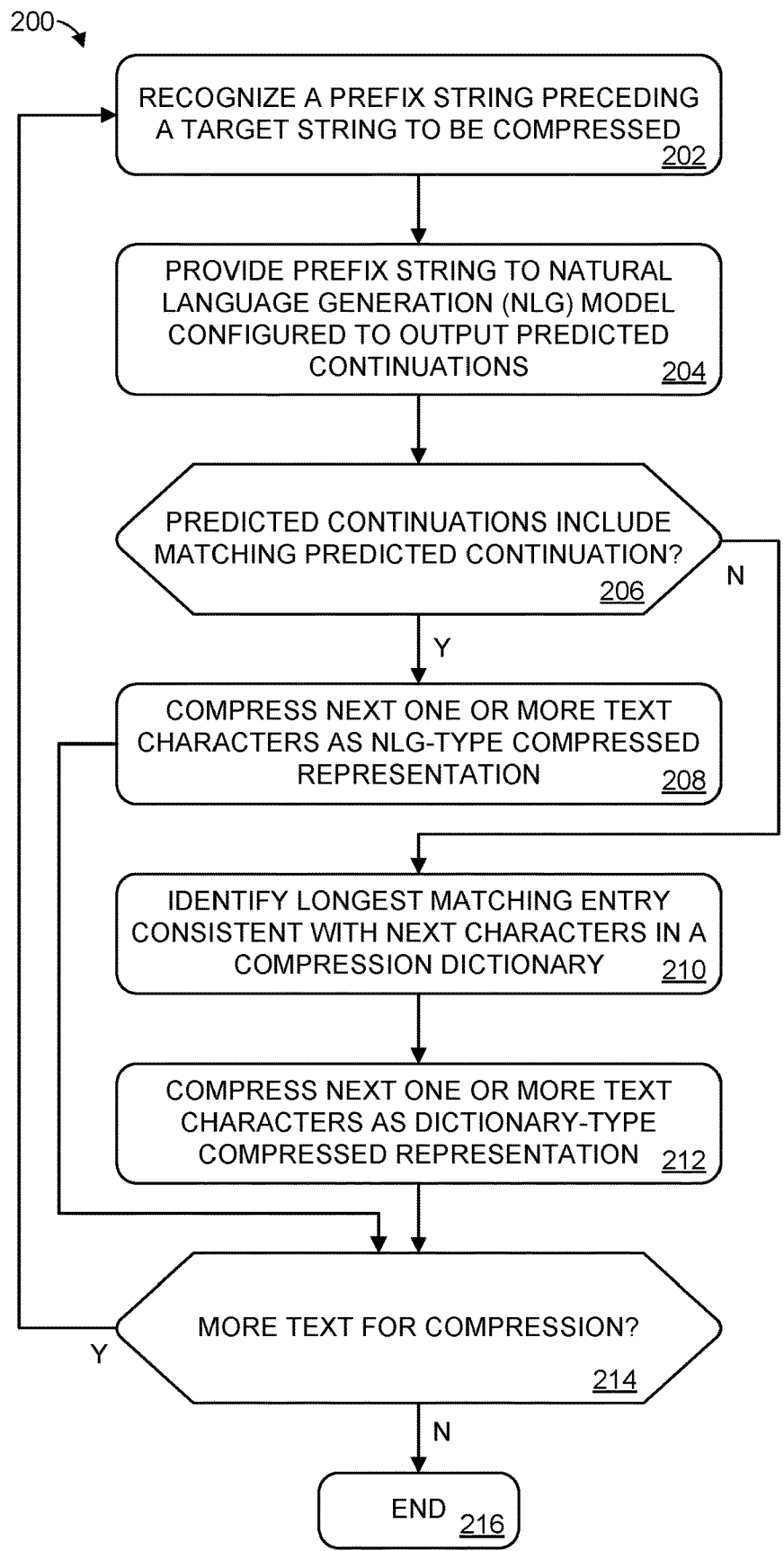
FIG. 2 illustrates an example method for text compression.

FIG. 2 illustrates an example method 200 for text compression. Method 200 may be implemented by any suitable computing system of one or more computing devices. Any computing device or devices used to implement method 200 may have any suitable capabilities, form factors, and hardware configurations. As non-limiting examples, method 200 may be implemented by a laptop computer, desktop computer, server, smartphone, or tablet. In some examples, method 200 may be implemented via computing system 800 described below with respect to FIG. 8.

At 202, method 200 includes recognizing a prefix string of one or more text characters, the prefix string preceding a target string of a plurality of text characters to be compressed. As discussed above, during the process of compressing text string 100 of FIG. 1, any characters that have not yet been compressed may be referred to as the "target string," and any or all text characters preceding the target string may be referred to as the "prefix string." As compression continues, text characters of the target string may be added to, or replace, text characters of the prefix string, until the target string is empty and the overall text string has been compressed. As such, method 200 may be repeated any number of times to output compressed representations of different text sequences of the text string, ultimately producing a compressed text string (e.g., compressed text string 104).

Furthermore, it will be understood that method 200 is primarily described from the standpoint of a compression process that is already in progress. In other words, from the standpoint of method 200, at least some text characters of the overall text string have already been compressed and added to the prefix string, while the target string includes the text characters of the overall text string that have not yet been compressed.

However, it will be understood that, in some cases, the prefix string may be empty—e.g., when the compression process is initially applied to the text string, and no characters have yet been compressed. In the event that there are no text characters preceding the current target of the compression process (e.g., the next characters of the target string to be compressed are the first characters of the larger text string), then any suitable text compression techniques may be used for compressing the first one or more characters of the text string. As one example, the NLG model may output one or more predicted continuations based on an empty prefix string, and a matching predicted continuation may be used for compressing the first characters of the text string. As another example, the first one or more text characters of the text string may be compressed through use of a compression dictionary (e.g., implemented via a Lempel-Ziv-Welch (LZW) text compression algorithm, or other suitable algorithm), as will be described in more detail below. From there, the first one or more text characters of the text string may be used as a prefix string for compressing later characters of the text string.

As another example approach, the prefix string may be manually specified by a user. For example, when the compression process is first applied to the text string, and thus there are no characters preceding the target string, a user may manually input a prefix string that can be provided to an NLG model.

Figure 3:
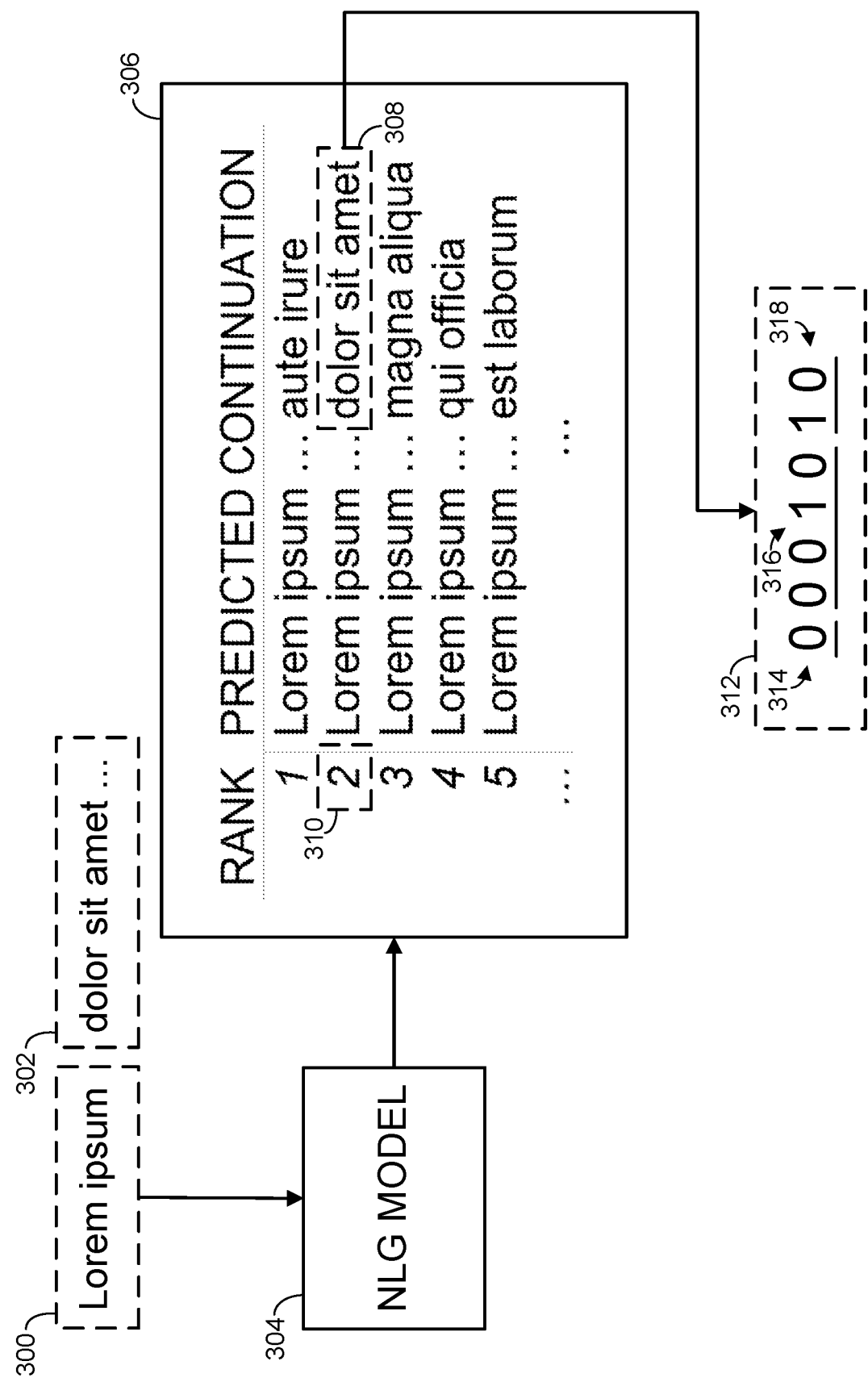
FIG. 3 schematically illustrates providing a prefix string to a natural language generation (NLG) model.

Recognizing a prefix string is schematically shown in FIG. 3, which reproduces a part of text string 100 shown in FIG. 1. As used herein, "recognizing" a prefix string may include recognizing or receiving the entire text string to be compressed—e.g., loading the text string from local memory, loading the text string from an external storage device, accessing the text string over a network, receiving the text string as part of a message or transmission from another computing device, and/or generally obtaining the text string from any suitable source—and determining which portion of the text string constitutes the prefix string at the current iteration of the compression process. As shown in FIG. 3, the text string includes a prefix string 300 (e.g., "Lorem ipsum"), which may include characters that have already been compressed, and a target string 302 (e.g., "dolor sit amet . . . ") of text characters to be compressed. Target string 302 is truncated to only three whole words in the example of FIG. 3, although it will be understood that this is done only for visual clarity. Rather, as discussed above, the "target string" includes any text characters of the larger text string that have not yet been compressed.

In the example of FIG. 3, the prefix string includes two whole words preceding the target string. In other examples, however, the prefix string may have any suitable length. For instance, the prefix string may include a predetermined number of characters, or a predetermined number of whole words—e.g., the prefix string may have a predetermined length of ten characters, or two whole words, or any whole words since the start of a current sentence, or substantially all text characters that have been compressed thus far during the text compression process. In other examples, the prefix string may have a variable length chosen heuristically based on the text that is being compressed. In some cases, one or more characters of the prefix string may be left uncompressed, such that those characters can later be used as a prefix string during decompression without requiring the characters to first be decompressed.

Furthermore, in the example of FIG. 3, the prefix string and the target string are separated by a word boundary. In this example, the word boundary is a space character, although other suitable word boundaries may be used (e.g., punctuation marks, hyphens, line breaks). In other examples, however, there need not be a word boundary between the prefix string and the target string.

It will be understood that each iteration of method 200 may result in compression of only part of the target string. Thus, as will be described in more detail below, the text compression techniques described herein may in some cases be repeated any number of times. In general, each iteration of method 200 will aim to compress the next one or more characters of the target string. In some iterations, several whole words may ultimately be compressed, while in other iterations, only a few characters may be compressed. Regardless, by continually applying the compression process to the next text characters of the target string until the target string is empty, the overall text string may gradually be compressed.

Furthermore, during each iteration of method 200, the text characters of the prefix string may be updated or replaced. For example, on each iteration, one or more text characters or whole words of target string 302 may be concatenated to prefix string 300 to produce a longer prefix string, or may replace one or more text characters or whole words that were previously included at the start of the prefix string (e.g., in cases where the prefix string has a maximum length). The result of this process may be a compressed text string (e.g., compressed text string 104), which may include a plurality of different compressed representations of a plurality of different text sequences within the text string.

Returning briefly to FIG. 2, at 204, method 200 includes providing the prefix string to an NLG model configured to output one or more predicted continuations to the prefix string, each of the one or more predicted continuations having an associated length. This is also schematically illustrated in FIG. 3, in which prefix string 300 is provided to an NLG model 304, which outputs a plurality of predicted continuations 306. Notably, this may occur regardless of whether the prefix string includes any text characters. In the event that the prefix string is empty (e.g., because no characters of the text string have yet been compressed), the prefix string may nonetheless be provided to the NLG model, which may still output one or more predicted continuations.

The NLG model may be implemented in any suitable way, making use of any suitable algorithms, artificial intelligence (AI), machine learning (ML), and/or other text-prediction models. As one non-limiting example, the herein-described techniques may utilize the Generative Pre-trained Transformer 3 (GPT-3) NLG model. Additional non-limiting examples of suitable AI and/or ML techniques will be described below with respect to FIG. 8. For the purposes of this disclosure, the NLG model is configured to, upon receiving a prefix string, output one or more predicted continuations to the prefix string in a manner that is consistently replicable—e.g., the same prefix string provided to the same NLG model at different times will result in the same set of predicted continuations being output in the same ranked order. It will be understood that such functionality may be implemented in various suitable ways.

In the example of FIG. 3, five specific predicted continuations to prefix string 300 are shown. It will be understood that the NLG model may output any suitable number of predicted continuations to the prefix string. In some cases, it may be beneficial to limit the number of predicted continuations output by the NLG model, or limit the number of predicted continuations that are considered during the compression process. For instance, the one or more predicted continuations to the prefix string may be limited to a predetermined number of predicted continuations—e.g., the computing system may only consider a top k number of predicted continuations (where k may be equal to 50, 100, 200, etc.). Thus, if the next one or more text characters of the target string begins with text that is not among the top k predicted continuations output by the NLG model, the computing device would instead use the compression dictionary as will be described in more detail below. Put another way, the compression dictionary may be used in cases where the NLG model fails to output a predicted continuation in its top k predicted continuations that is consistent with the next one or more text characters of the target string to be compressed. Limiting the number of predicted continuations that considered for compression, as described below with reference to steps 206 and 208, advantageously limits the search space thus increasing search efficiency, as well as decreasing the maximum number of bits that will be used to compress the next one or more characters of the target string (in the event that a matching predicted continuation is identified).

As another example, each predicted continuation output by the NLG model may have an associated probability value that expresses the estimated likelihood that the predicted continuation is consistent with the actual text following the prefix string (e.g., the next one or more text characters of the target string). Relatively high-ranking predicted continuations may have relatively high probability values, while lower-ranking continuations may have correspondingly lower probability values. To this end, the one or more predicted continuations to the prefix string may be limited to any predicted continuations having associated probability values that exceed a probability threshold. As one example, the probability threshold may be 1%, and thus the one or more predicted continuations may include any continuations having higher than a 1% probability value. It will be understood, however, that any suitable probability threshold may be used, and/or any other suitable method may be used to limit the number of predicted continuations that are compared to the next one or more text characters of the target string and/or are otherwise considered for compression.

In some examples, a predicted continuation of the one or more predicted continuations may include one or more whole words predicted to follow the prefix string. This is the case in FIG. 3, in which each of the predicted continuations shown include two or more whole words. It will be understood, however, that this need not be the case. Rather, in some examples, one or more predicted continuations output by the NLG model may include text characters that form a partial word, or complete a word started in the prefix string, or do not correspond to a word at all. Furthermore, it will be understood that the various predicted continuations output by the NLG model may be different lengths. For instance, one predicted continuation may include one whole word, while another predicted continuations may include several whole words. In cases where multiple predicted continuations each match the next one or more characters of the target string, the longest matching predicted continuation may be used.

Furthermore, in FIG. 3, each of the predicted continuations include English letters and space characters. It will be understood, however, that this is not limiting. Rather, predicted continuations output by an NLG model may include any variety of suitable text characters, including letters, punctuation (e.g., periods, commas, hyphens, exclamation marks, question marks, ellipses), mathematical symbols, emoji, or characters that are specific to languages besides English.

Returning briefly to FIG. 2, at 206, method 200 includes determining whether the one or more predicted continuations include a matching predicted continuation relative to the next one or more text characters of the target string. This is also schematically illustrated in FIG. 3. In this example, the plurality of predicted continuations 306 does include a matching predicted continuation 308 that is consistent with the next one or more text characters of the target string 302. In other words, one of the predicted continuations output by the NLG model includes the same sequence of text characters in the same order as the next one or more text characters of the target string. As with the other predicted continuations, matching predicted continuation 308 has an associated rank 310—in this case, rank 2.

It will be understood that, in this example, the predicted continuation matches the text "dolor sit amet" exactly. It will be understood, however, that the compression process generally aims to match the next one or more text characters of the target string, regardless of how many text characters that includes. Therefore, in alternate examples, a matching predicted continuation may match more characters of the target string (e.g., text characters occurring after the word "amet"), or match fewer text characters of the target string (e.g., only the first two whole words "dolor sit"). From there, the compression process may repeat any number of times until no text characters remain in the target string.

Returning briefly to FIG. 2, if the one or more predicted continuations do include a matching predicted continuation (YES at 206), then at 208, method 200 includes compressing the next one or more text characters of the target string as an NLG-type compressed representation that includes the associated rank of the matching predicted continuation. This is also schematically illustrated in FIG. 3, showing an example NLG-type compressed representation 312.

In the example of FIG. 3, NLG-type compressed representation 312 takes the form of a series of computer bits, divided into multiple sequences that encode different types of information about the next one or more text characters of the target string. It will be understood that compressed representation 312 may be preceded and/or succeeded by any number of bits corresponding to other text sequences of the text string, and/or any other suitable information. NLG-type compressed representation 312 includes a first indicator bit 314 having a first value (e.g., 0) indicating that the next one or more text characters of the target string are compressed as the associated rank of the matching predicted continuation. In the simplified example of FIG. 3, compressed representation 312 includes an encoded length 316 that precedes an encoded value 318. Encoded value 318 has a value of "10," indicating that the matching predicted continuation has an associated rank of two, which is consistent with associated rank 310 discussed above.

The associated rank of the matching predicted continuation may be encoded using a prefix-free encoding system, such as Gamma, Delta, VByte, or static Huffman, as non-limiting examples. This may be done to ensure that different associated ranks within the compressed representation can be uniquely distinguished without use of separation markers. In other words, a prefix-free encoding system may ensure that no individual sequence in the compressed representation can be misconstrued as the prefix of a different, longer sequence. Given this, it will be understood that the encoded length 316 shown in FIG. 3 is a deliberately simplified example included for the sake of illustration. In practical examples, the encoded value of the associated rank of the matching predicted continuation may be distinguished from other bits of the compressed representation using any suitable encoding scheme.

Furthermore, it will be understood that the specific compressed representation 312 shown in FIG. 3 is a non-limiting example. In general, a "NLG-type compressed representation" may encode the associated rank of a matching predicted continuation relative to a next one or more text characters of the target string using fewer total bits than would be the case if each text character was encoded separately. It will be understood that this may be achieved using any variety of suitable data structures.

The above description has primarily focused on each predicted continuation output by the NLG model having an associated rank, which is then compressed as part of the NLG-type compressed representation. It will be understood, however, that this need not always be the case. As another approach, the computing device may output a distribution over the top-k prediction continuations and encode this distribution via arithmetic coding. Because the set of predicted continuations is limited to the top-k predicted continuations, this may avoid the problem where a relatively large number of bits is used to encode unexpected words having relatively low probabilities assigned by the prediction model.

The present disclosure has thus far assumed that the one or more predicted continuations output by the NLG model includes a matching predicted continuation. However, this need not always be the case. Returning briefly to FIG. 2, if no predicted continuations of the one or more predicted continuations match the next one or more text characters of the target string (NO at 206), then at 210, method 200 includes identifying a longest matching entry in a compression dictionary that is consistent with the next one or more text characters of the target string.

This is schematically shown in FIG. 4, again showing target string 302 truncated to three whole words "dolor sit amet," along with a portion of an example compression dictionary 400. As shown, the compression dictionary includes a plurality of entries, each having an associated dictionary index value. The compression dictionary may in some cases be implemented via a suitable text compression algorithm—e.g., the LZW text compression algorithm, the Lempel-Ziv-Storer-Szymanski (LZSS) algorithm, the LZ77 or LZ78 algorithms, or the DEFLATE algorithm.

In some examples, the compression dictionary described herein may be iteratively developed based on character strings present in the larger text string to be compressed. For example, the computing device may start with a default seed dictionary having a limited number of seed entries, where each seed entry includes a single text character and an associated dictionary index value. This seed dictionary may, for example, be hardcoded into the compression algorithm. As the text string is compressed, individual characters of the text string may be represented as the dictionary index values of the dictionary entries matching the individual characters. Furthermore, each time a dictionary entry is used, the algorithm may add an additional entry to the dictionary that concatenates the selected entry with the next character of the target string, resulting in a dictionary entry that is two characters long. If that two-character sequence is later repeated in the target string, it may be compressed as the dictionary index value of the new entry. Furthermore, another new entry may be added that concatenates the two-character sequence with the next character of the target string, to give a three-character entry in the compression dictionary.

In this manner, the compression dictionary may gradually grow to include more and more entries, corresponding to longer and more complicated sequences of text characters found in the text string, without adding entries corresponding to character strings that are not present in the text string. Furthermore, new entries may be added to the compression dictionary based on text characters compressed using the NLG model, in addition to text characters compressed using the compression dictionary. In this manner, use of the compression dictionary may be referred to as a "shadow process" or "shadow compressor," in that the iterative updating of the compression dictionary may occur continuously during the compression process, regardless of whether such compression is occurring based on the compression dictionary or the NLG model. In other words, the compression dictionary may be specific to the text string under compression. As additional entries are added to the dictionary, the index values of the additional dictionary entries may be used to represent matching character sequences in the target string. In this manner, the compression efficiency of the algorithm that implements the compression dictionary may gradually improve as more of the target string is compressed, and more entries are added to the dictionary.

Figure 4:
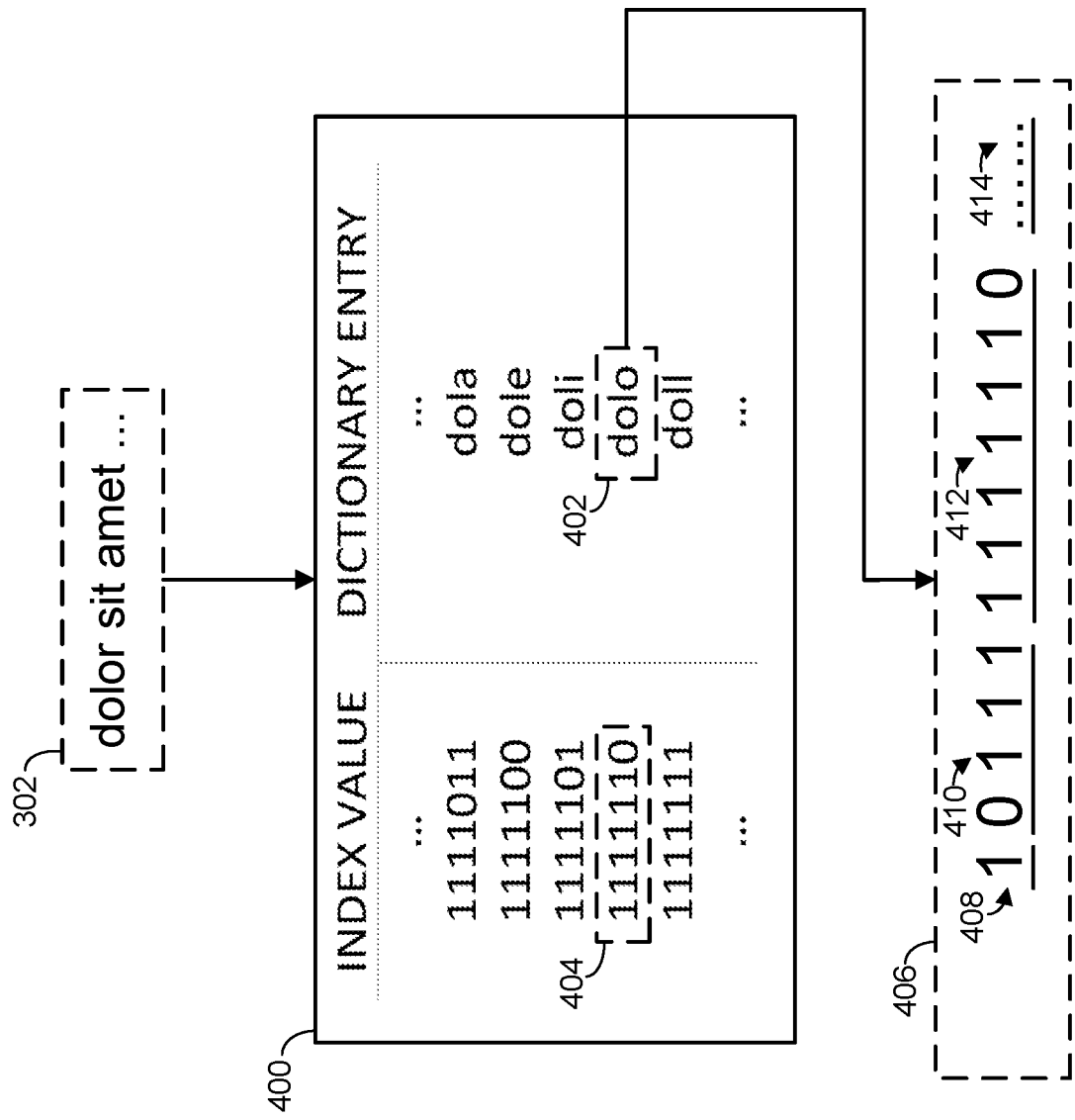
FIG. 4 schematically illustrates identifying a longest matching entry in a compression dictionary consistent with the next one or more text characters of the target string.

Regardless, in the example of FIG. 4, compression dictionary 400 includes several entries, each having associated dictionary index values. The computing device identifies a longest matching entry 402 in the compression dictionary that is consistent with the next one or more text characters of the target string, the longest matching entry having an associated dictionary index value 404. The longest matching entry may then be used to represent the next one or more text characters of the target string in a dictionary-type compressed representation, as will be described in more detail below.

In the specific example of FIG. 4, the longest matching entry includes four text characters "dolo" matching the next four text characters of the target string. It will be understood that this is a non-limiting example. Rather, as discussed above, the compression process generally aims to compress as many characters of the target string as possible during each iteration. Thus, in alternate examples, the "longest matching entry" may include a different number N of text characters, provided it still matches the next N characters of the target string.

Returning briefly to FIG. 2, at 212, method 200 includes compressing the next one or more text characters of the target string as a dictionary-type compressed representation that includes the dictionary index value of the longest matching entry. This is schematically shown in FIG. 4, showing a dictionary-type compressed representation 406. The dictionary-type compressed representation includes a second indicator bit 408 having a second value (e.g., 1) indicating that the next one or more text characters of the target string are compressed as the dictionary index value of the longest matching entry. As with NLG-type compressed representation 312, compressed representation 406 may utilize any suitable prefix-free encoding system such as Gamma, Delta, VByte, or static Huffman, and/or any other suitable encoding scheme, to encode the dictionary index value of the longest matching entry. This may be done to ensure that different associated ranks and different dictionary index values encoded within different compressed representations can be uniquely distinguished without use of separation markers. In other words, a prefix-free encoding system may ensure that no individual sequences in the compressed representations can be misconstrued as the prefix of a different, longer sequence.

In the simplified example of FIG. 4, compressed representation 406 includes an example encoded length 410 preceding an encoded value 412 of the dictionary index value. Specifically, encoded value 412 has a value of "1111110," corresponding to the dictionary index value of the longest matching entry. It will be understood, however, that any other suitable technique may be used to encode the length of the encoded value, and/or the encoded value may be distinguished from other bits of the compressed representation in any suitable way.

In FIG. 4, the longest matching dictionary entry is less than a whole word. It will be understood, however, that this need not always be the case. Rather, in some examples, the longest matching dictionary entry may correspond to the next whole word, or more than one whole word, of the target string. In cases where the longest matching entry includes more than one whole word (e.g., a whole word followed by one or more characters of a second word, or two or more whole words), the longest matching dictionary entry may in some cases optionally be replaced with a shorter matching entry that matches only the first whole word of the target string.

In cases where the longest matching entry includes less than a next whole word of the target string, the computing device may in some cases compress any remaining text characters of the next whole word of the target string via one or more additional dictionary-type compressed representations. This is shown in FIG. 4, where the dictionary-type compressed representation is succeeded by additional bits 414 that may correspond to a subsequent dictionary-type compressed representation—e.g., compressing the character "r" of the whole word "dolor" that was not matched by the longest matching dictionary entry. Notably, the subsequent dictionary-type compressed representation may in some cases include subsequent indicator bits and/or length indicators separating the encoded values of each dictionary entry.

As discussed above, the compression dictionary may in some cases be iteratively built as a text string is compressed.

Figure 5:
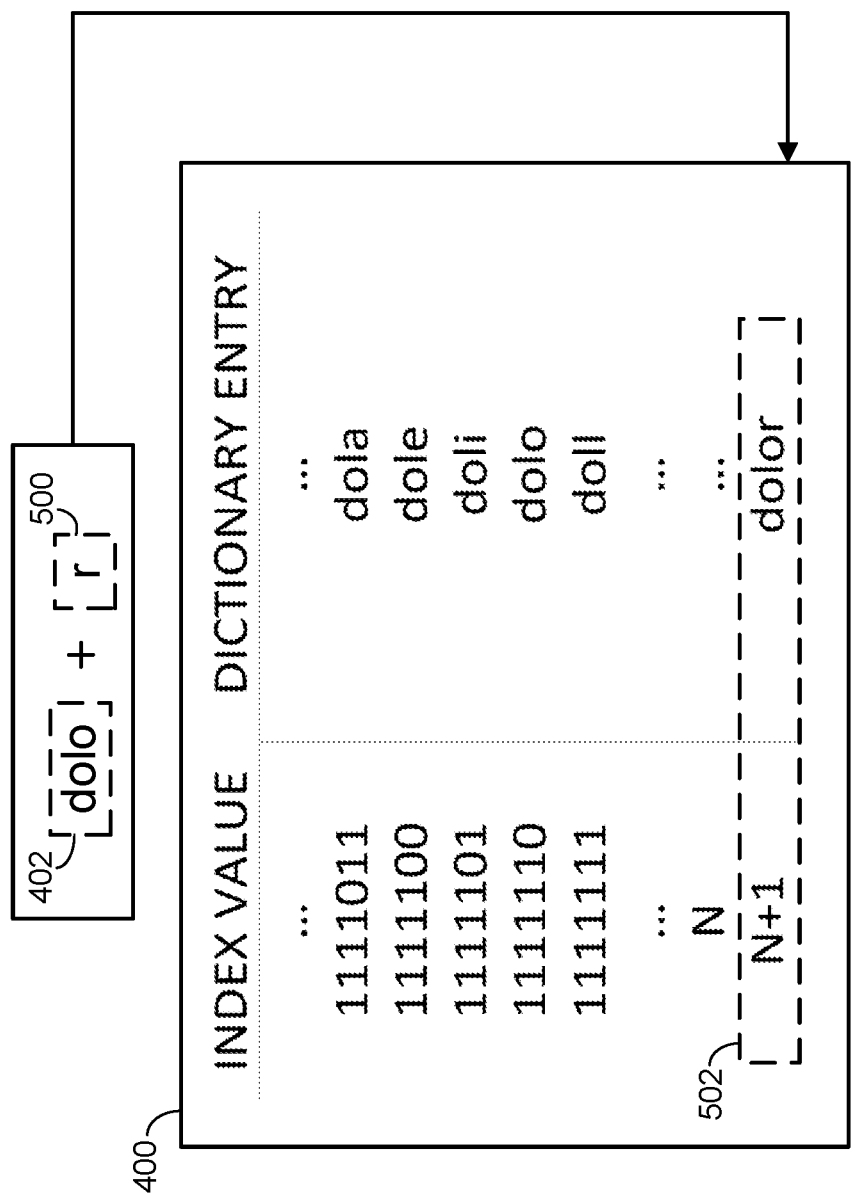
FIG. 5 schematically illustrates adding a new entry to the compression dictionary of FIG. 4.

To this end, after the longest matching entry is identified, a new entry may be added to the compression dictionary. This is schematically illustrated in FIG. 5, again showing longest matching entry 402. As shown, the longest matching entry is concatenated with a first character 500 ("r") of the target string not matched by the longest matching entry. The result of this concatenation is added to the compression dictionary as a new entry 502. Thus, in the event that the character sequence "dolor" is again encountered later during compression of text string 100, the character sequence may be compressed as the associated dictionary entry value of the new dictionary entry 502 (assuming that no matching predicted continuation is identified, and therefore the compression dictionary is used).

It will be understood that new entries to the compression dictionary need not only be added each time a longest matching entry from the dictionary is used to compress a text sequence in the text string. Rather, in some examples, the computing device may add one or more entries to the compression dictionary that match one or more prior text sequences having previously been compressed based on predicted continuations output by the NLG model. For example, each time a predicted continuation is used to compress a text sequence of the text string, the computing device may add one or more additional entries to the dictionary consistent with the compressed characters. Additionally, or alternatively, prior to identifying the longest matching entry in the compression dictionary, the computing device may add one or more new entries to the compression dictionary based on characters that have been compressed since a last time that the compression dictionary was updated.

In this manner, the compression dictionary may continue to grow as a shadow process, even as the NLG model is used to compress text sequences of the text string, and regardless of whether any of the newly-added dictionary entries are ever used to compress a subsequent text sequence of the text string. This may increase the chance that, in the event of a future text sequence of the target string not matching any predicted continuations output by the NLG model, a relatively high quality (e.g., multiple characters long) dictionary entry will already exist that matches at least part of the text sequence.

Returning briefly to FIG. 2, at 214, method 200 includes determining whether the target string includes more text for compression. Notably, this may be done regardless of whether the next one or more text characters of the target string was compressed as the NLG-type compressed representation at 208, or compressed as the dictionary-type compressed representation at 212.

If YES at 214, then method 200 may return to 202. For example, after compressing the next one or more text characters of the target string as either the NLG-type compressed representation or the dictionary-type compressed representation, the computing device may use some to all of the compressed text characters as part of an updated prefix string for compressing a subsequent next one or more text characters of the target string. For example, compressed characters may be concatenated to the prior prefix string to give a longer prefix string, and/or may replace corresponding characters at the beginning of the prefix string to preserve a maximum length for the prefix.

From here, method 200 may repeat any number of times substantially as described above. In this manner, the computing device may ultimately output a compressed text string (e.g., compressed text string 104). The compressed text string may include a plurality of compressed representations corresponding to different text sequences of the text string, the plurality of compressed representations including both NLG-type compressed representations and dictionary-type compressed representations.

Figure 6:
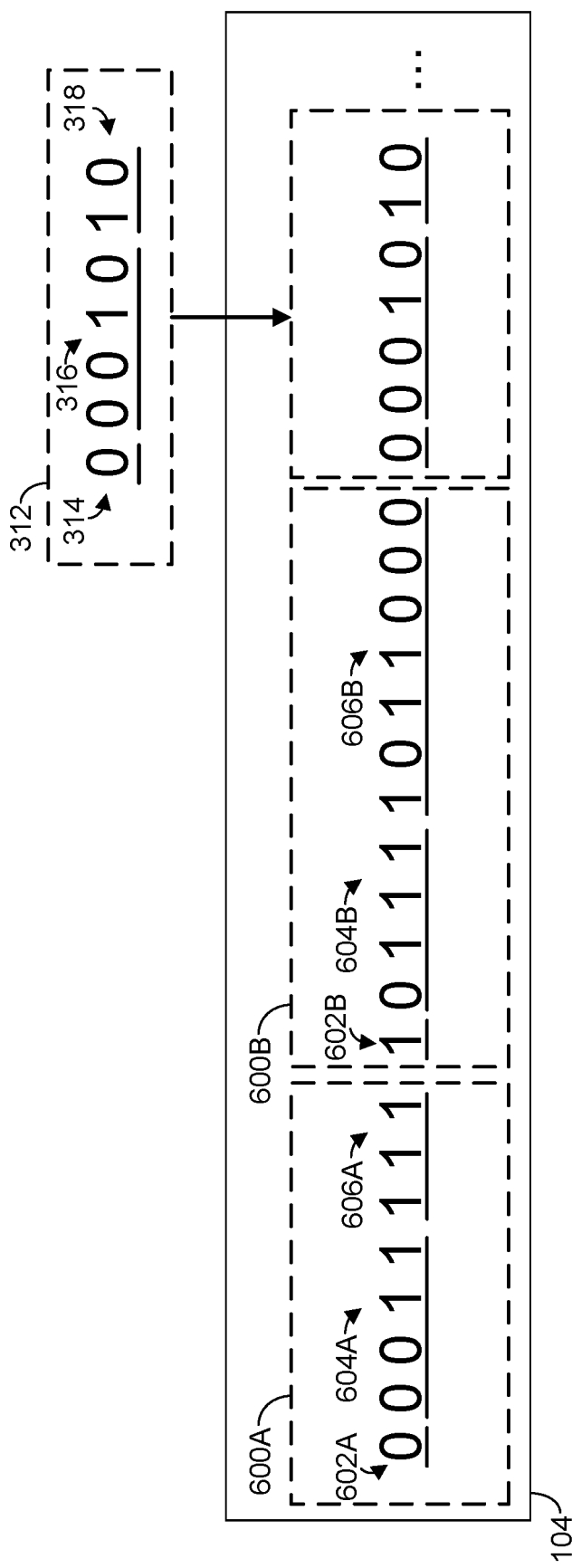
FIG. 6 schematically illustrates an example compressed text string including a plurality of compressed representations of different text sequences of the text string.

This is schematically illustrated in FIG. 6, showing another view of compressed text string 104. As shown, a text sequence of target string 302 has been compressed as NLG-type compressed representation 312, and appended to the compressed text string. Additional iterations of method 200 may compress additional text sequences of the text string, which may be appended to the compressed text string after compressed representation 312. Furthermore, as shown, compressed text string 104 includes other compressed representations 600A and 600B corresponding to preceding text sequences of the text string—e.g., a plurality of text characters occurring before "dolor" in target string 302.

Compressed representation 600A is an NLG-type compressed representation, as indicated by indicator bit 602A having the first value (e.g., 0). By contrast, compressed representation 600B is a dictionary-type compressed representation, given by the indicator bit 602B having the second value (e.g., 1). In general, each NLG-type compressed representation may include an indicator bit having a value (e.g., 0) indicating that the next one or more text characters of the target string is compressed as the associated rank of the matching predicted continuation, and each dictionary-type compressed representation may include the indicator bit having a different value (e.g., 1) indicating that the next one or more text characters of the target string is compressed as the dictionary index value of the longest matching entry.

Furthermore, as discussed above, each NLG-type compressed representation and each dictionary-type compressed representation may use any suitable prefix-free encoding system such as Gamma, Delta, VByte, or static Huffman, and/or any other suitable encoding scheme for compressing natural numbers, as non-limiting examples. This may be done to ensure that different associated ranks and different dictionary index values encoded within different compressed representations can be uniquely distinguished without use of separation markers. In the deliberately simplified and non-limiting example of FIG. 6, compressed representation 600A includes an example encoded length 604A prior to an encoded rank 606A of a matching predicted continuation, while compressed representation 600B includes an example encoded length 604B prior to an encoded dictionary index value 606B of a longest matching dictionary entry.

Returning briefly to FIG. 2, if NO at 214, then method 200 ends at 216. In other words, the compressed text characters may be the last text characters of the target string, meaning the larger text string is now fully represented as a compressed text string.

While method 200 is described with reference to two different compression techniques—NLG-type compression and dictionary-type compression—it is to be understood that other compression techniques can be incorporated into method 200. Furthermore, some text may be left uncompressed. As one example, if it is determined that encoding an NLG-type rank would use more bits than leaving text uncompressed, method 200 can be expanded to make this check and leave the text uncompressed. In such cases, more than one indicator bit may be used to differentiate between three or more compression techniques.

Figure 7:
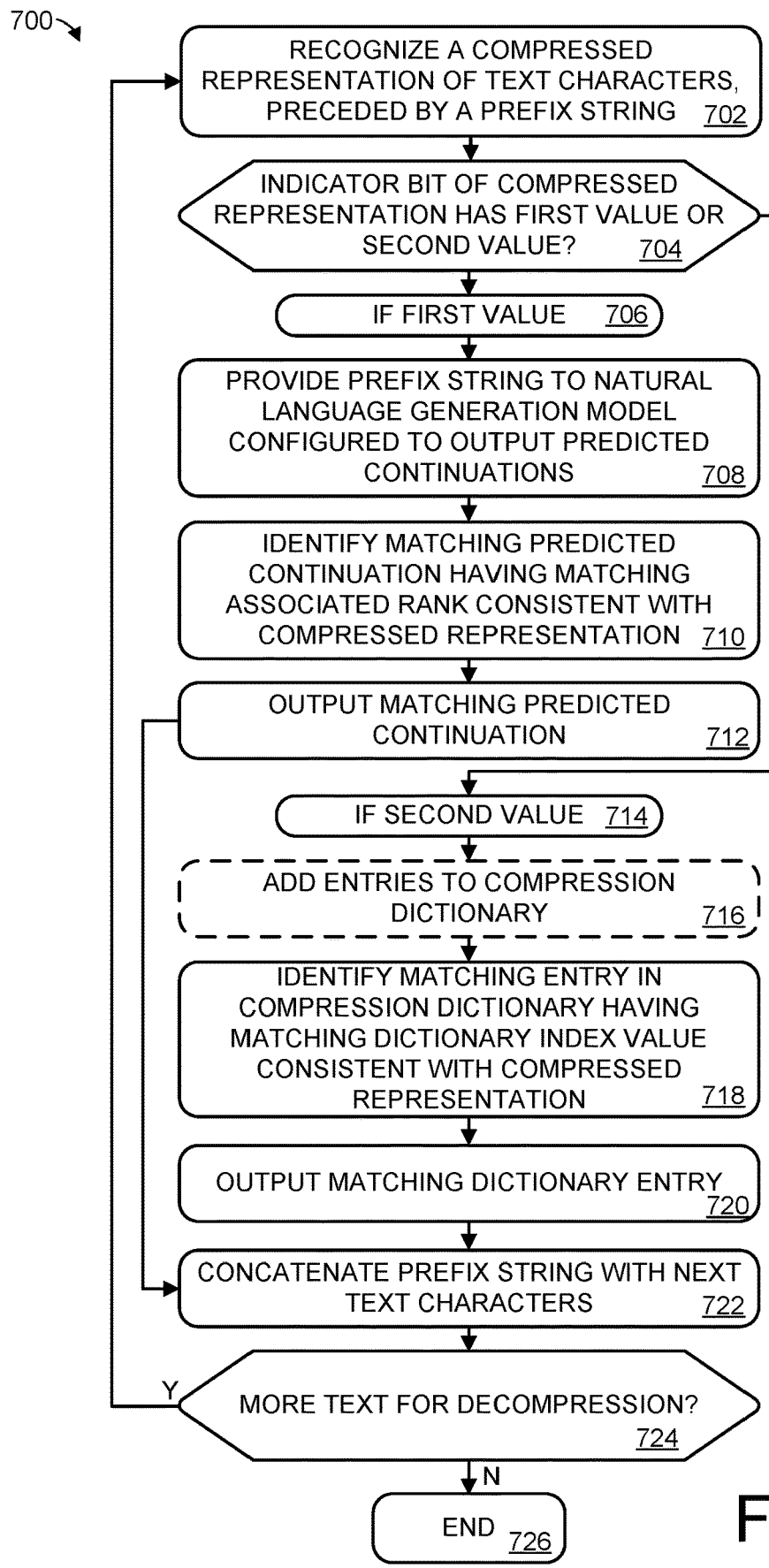
FIG. 7 illustrates an example method for text decompression.

The present disclosure has thus far focused on compression of a target string. Turning now to FIG. 7, an example method 700 for text decompression is illustrated. For the purposes of decompression, the "target string" includes any text characters that have not yet been decompressed. As with method 200, method 700 may be implemented by any suitable computing system of one or more computing devices. Any computing device or devices used to implement method 700 may have any suitable capabilities, form factors, and hardware configurations. In some examples, method 700 may be implemented via computing system 800 described below with respect to FIG. 8.

At 702, method 700 includes recognizing a compressed representation that represents a next one or more text characters of a target string to be decompressed. As with the text compression process described above, the decompression process of FIG. 7 is generally described with the assumption that at least some characters preceding a currently-targeted portion of the target string have already been decompressed, and that such characters may be used as a prefix string. For example, the computing device may receive compressed representation 312 shown in FIG. 3, or compressed representation 406 shown in FIG. 4, both of which represent a part of the target string 302 that is preceded by prefix string 300 of text string 100. It will be understood, however, that when the decompression process first begins, the prefix string may be empty. As text is decompressed (e.g., via predicted continuations of the NLG model or entries in the compression dictionary), such characters may be added to the prefix string.

As discussed above, "recognizing" the compressed representation may include loading the compressed representation from local memory, loading the compressed representation from an external storage device, accessing the compressed representation over a network, receiving the compressed representation as part of a message or transmission from another computing device, and/or generally obtaining the compressed representation from any suitable source. Furthermore, for the purposes of FIG. 7, it will be understood that the received compressed representation was compressed substantially as described above with respect to FIG. 2—e.g., the compressed representation includes an encoded value for either a matching predicted continuation output by an NLG model, or a longest matching entry in a compression dictionary, preceded by an indicator bit having either a first value or a second value.

Furthermore, as discussed above, the compressed representation of the next one or more text characters of the target string may be a portion of a larger compressed text string, the compressed text string including a plurality of different compressed representations corresponding to a plurality of different text sequences of the text string. Thus, method 700 may be repeated any number of times to decompress each of the plurality of compressed representations to recreate the larger text string. Furthermore, "recognizing" the compressed representation may include accessing the compressed text string and identifying a compressed representation within the compressed text string.

It will be understood that the decompression process described herein will utilize the same NLG model and compression dictionary algorithm described above with respect to initial compression of the compressed representation. This may be done to ensure that the associated ranks of predicted continuations in the compressed text string, as well as the dictionary index values corresponding to dictionary entries, can be reproduced during decompression to restore the original text characters. To this end, the compressed text string may in some cases include one or more headers, footers, metadata, etc., specifying a version number of an NLG model, dictionary compression algorithm, or other suitable information to facilitate decompression.

As discussed above, for the purposes of decompression, the prefix string includes any or all text characters that have already been decompressed—e.g., by performing steps of method 700. In some examples, the prefix string may initially be empty—e.g., include zero text characters. As text characters of the target string are decompressed, text characters may be added to the prefix string for use in later iterations of the decompression process. For example, initial text characters of the target string may be encoded using single-character seed entries in the compression dictionary, and as such text characters are decompressed, they may be used as a prefix string and provided to an NLG model. As another example, the compression process may leave one or more characters at the beginning of the target string uncompressed, and such characters may be used as the initial prefix string during decompression.

As discussed above, the prefix string may have any suitable length—e.g., a predetermined number of whole words, a predetermined number of text characters, any whole words since the start of a current sentence, or all of the text characters that have been decompressed thus far. For instance, in a scenario where the prefix string has a fixed number of text characters, then new text characters may be appended to the end of the prefix string as they are decompressed, while corresponding text characters may be dropped from the beginning of the prefix string. A similar process may be used in scenarios where the prefix string includes a predetermined number of whole words or sentences, for example. In the case where the prefix string has a variable length (e.g., chosen heuristically based on the text that is being decompressed), the length of the prefix string may be encoded in the compressed representation in any suitable way.

Furthermore, it will be understood that decompression of the compressed text string will start at the same point (e.g., use the same initial prefix string and next one or more text characters of the target string), and proceed in the same order, as the compression process earlier used to compress the text string. This may ensure that the character strings provided to the NLG model, and/or compared to the compression dictionary, will yield the same results as during the earlier compression process, thereby enabling the text to be decompressed.

Continuing with FIG. 7, at 704, method 700 includes determining whether an indicator bit of the compressed representation has a first value or a second value. For example, in compressed representation 312, the indicator bit has the first value (e.g., 0), while in compressed representation 406, the indicator bit has the second value (e.g., 1).

At 706, if the indicator bit has the first value, then method 700 proceeds to 708, where the prefix string is provided to the same NLG model that was used to compress the text string. As described above, the output of the NLG model is consistently replicable. In other words, the same prefix string provided to the same NLG model at different times will result in the same set of predicted continuations being output, having the same associated ranks. Thus, providing prefix string 300 to NLG model 304 as part of the decompression process will result in the same set of predicted continuations 306, each having the same associated ranks.

Continuing with method 700, at 710, the method includes identifying a matching predicted continuation having a matching associated rank that is consistent with the compressed representation. As discussed above, compressed representation 312 includes an encoded value 318, having a value of "10" that corresponds to a rank of two. Thus, identifying the matching predicted continuation includes identifying the predicted continuation in the one or more predicted continuations that has an associated rank of two. The computing device may therefore identify predicted continuation 308, having an associated rank 310 of two, as the matching predicted continuation.

Continuing with method 700, at 712, method 700 includes outputting the matching predicted continuation as the next one or more text characters of the target string. For example, after predicted continuation 308 is identified as the matching predicted continuation, the computing device may append it to prefix string 300, and/or append it to one or more previously decompressed text sequences of the text string, in the process of decompressing a compressed text string (e.g., compressed text string 104).

In some cases, the indicator bit of the compressed representation may have the second value rather than the first value. Thus, at 714, if the indicator bit has the second value (e.g., 1), then method 700 proceeds to 716. At 716, method 700 optionally includes adding one or more additional entries to a compression dictionary. As discussed above, the compression dictionary (e.g., compression dictionary 400) includes a plurality of entries each having associated dictionary index values. In many cases, the compression dictionary will be dynamically updated with new entries during both compression and decompression. For example, each time a compressed representation includes an indicator bit having the second value, the computing device may update the compression dictionary with additional entries corresponding to character sequences previously decompressed based on predicted continuations output by the NLG model. This may serve to ensure that any dictionary index values referenced in the compressed representation have corresponding dictionary entries in the compression dictionary.

In other examples, however, the computing device may use a compression dictionary that is fixed—e.g., is not updated with new entries during either compression or decompression. Such a fixed compression dictionary may, for example, be hardcoded into the compression algorithm, or retrieved from any local or remote source when needed.

Continuing with method 700, at 718, the method includes identifying a matching entry in the compression dictionary. For the purposes of decompression, the matching entry has a matching dictionary index value that is consistent with the compressed representation. For example, compressed representation 406 has an encoded value 412 of "1111110," which is the dictionary index value of an entry in the dictionary. Given this, the computing device may identify dictionary entry 402 ("dolo") as the matching dictionary entry. Notably, because the decompression process starts at the same character and runs in the same direction as in the compression process, the entries of the compression dictionary will be recreated identically during decompression. This may ensure that any dictionary index values encoded in a compressed target string can be resolved to a matching dictionary entry during decompression.

Continuing with method 700, at 720, the method includes outputting the matching dictionary entry as the next one or more text characters of the target string. For example, after dictionary entry 402 is identified as the matching dictionary entry, it may be appended to prefix string 300, and/or one or more previously decompressed text sequences of the text string, in the process of decompressing a compressed text string (e.g., compressed text string 104).

To this end, continuing with method 700, at 722, the method includes concatenating the prefix string with the decompressed next one or more text characters of the target string. This may be done regardless of whether the next one or more text characters of the target string were compressed as an NLG-type compressed representation or a dictionary-type compressed representation. By repeating method 700 for a number of iterations, the target string may be incrementally decompressed.

Notably, in the case where a matching dictionary entry is used, the matching dictionary entry may include fewer text characters than the next whole word of the target string. In such cases, the compressed representation may in some cases be followed by one or more additional dictionary-type compressed representations corresponding to one or more different entries of the compression dictionary. Such additional dictionary-type compressed representations may represent any text characters of the next whole word of the target string not matched by the prior dictionary-type compressed representation, until a word boundary is reached.

Continuing with method 700, at 724, the method includes determining whether the compressed representation includes more text for decompression. If so (YES at 724), method 700 returns to 702, where the decompression process may repeat substantially as described above. If there is no further text for decompression (NO at 724), method 700 ends at 726.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

Figure 8:
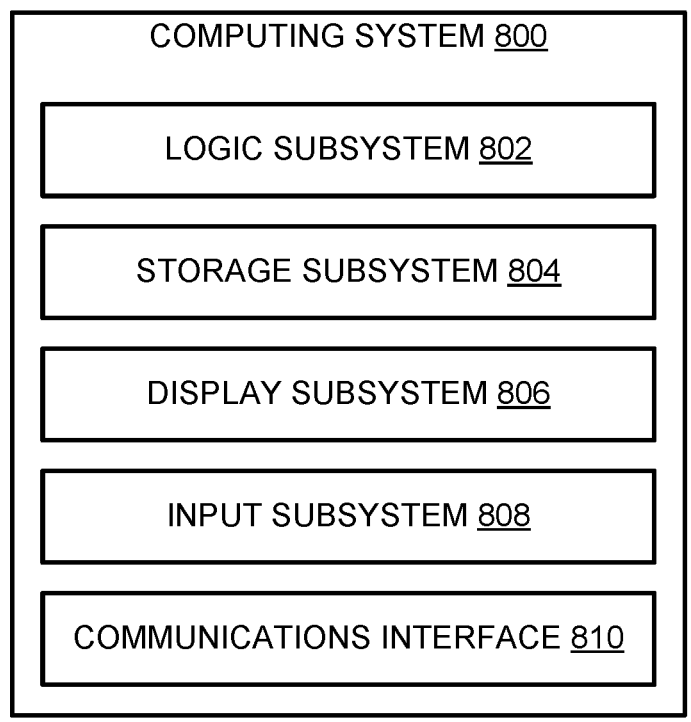
FIG. 8 schematically shows an example computing system.

FIG. 8 schematically shows a simplified representation of a computing system 800 configured to provide any to all of the compute functionality described herein. In particular, any or all of the text compression and/or text decompression processes described herein may be implemented by computing system 800. Computing system 800 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 800 includes a logic subsystem 802 and a storage subsystem 804. Computing system 800 may optionally include a display subsystem 806, input subsystem 808, communication subsystem 810, and/or other subsystems not shown in FIG. 8.

Logic subsystem 802 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 804 includes one or more physical devices configured to temporarily and/or permanently hold computer information such as data and instructions executable by the logic subsystem. When the storage subsystem includes two or more devices, the devices may be collocated and/or remotely located. Storage subsystem 804 may include volatile, nonvolatile, dynamic, static, read/write, read-only, random-access, sequential-access, location-addressable, file-addressable, and/or content-addressable devices. Storage subsystem 804 may include removable and/or built-in devices. When the logic subsystem executes instructions, the state of storage subsystem 804 may be transformed—e.g., to hold different data.

Aspects of logic subsystem 802 and storage subsystem 804 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

Machines may be implemented using any suitable combination of state-of-the-art and/or future machine learning (ML), artificial intelligence (AI), and/or natural language generation (NLG) techniques. Non-limiting examples of techniques that may be incorporated in an implementation of one or more machines include support vector machines, multi-layer neural networks, convolutional neural networks (e.g., including spatial convolutional networks for processing images and/or videos, temporal convolutional neural networks for processing audio signals and/or natural language sentences, and/or any other suitable convolutional neural networks configured to convolve and pool features across one or more temporal and/or spatial dimensions), recurrent neural networks (e.g., long short-term memory networks), associative memories (e.g., lookup tables, hash tables, Bloom Filters, Neural Turing Machine and/or Neural Random Access Memory), word embedding models (e.g., GloVe or Word2Vec), unsupervised spatial and/or clustering methods (e.g., nearest neighbor algorithms, topological data analysis, and/or k-means clustering), graphical models (e.g., (hidden) Markov models, Markov random fields, (hidden) conditional random fields, and/or AI knowledge bases), and/or natural language processing techniques (e.g., tokenization, stemming, constituency and/or dependency parsing, and/or intent recognition, segmental models, and/or supersegmental models (e.g., hidden dynamic models)).

In some examples, the methods and processes described herein may be implemented using one or more differentiable functions, wherein a gradient of the differentiable functions may be calculated and/or estimated with regard to inputs and/or outputs of the differentiable functions (e.g., with regard to training data, and/or with regard to an objective function). Such methods and processes may be at least partially determined by a set of trainable parameters. Accordingly, the trainable parameters for a particular method or process may be adjusted through any suitable training procedure, in order to continually improve functioning of the method or process.

Non-limiting examples of training procedures for adjusting trainable parameters include supervised training (e.g., using gradient descent or any other suitable optimization method), zero-shot, few-shot, unsupervised learning methods (e.g., classification based on classes derived from unsupervised clustering methods), reinforcement learning (e.g., deep Q learning based on feedback) and/or generative adversarial neural network training methods, belief propagation, RANSAC (random sample consensus), contextual bandit methods, maximum likelihood methods, and/or expectation maximization. In some examples, a plurality of methods, processes, and/or components of systems described herein may be trained simultaneously with regard to an objective function measuring performance of collective functioning of the plurality of components (e.g., with regard to reinforcement feedback and/or with regard to labelled training data). Simultaneously training the plurality of methods, processes, and/or components may improve such collective functioning. In some examples, one or more methods, processes, and/or components may be trained independently of other components (e.g., offline training on historical data).

Language models may utilize vocabulary features to guide sampling/searching for words for generation of text. For example, a language model may be at least partially defined by a statistical distribution of words or other vocabulary features. For example, a language model may be defined by a statistical distribution of n-grams, defining transition probabilities between candidate words according to vocabulary statistics. The language model may be further based on any other appropriate statistical features, and/or results of processing the statistical features with one or more machine learning and/or statistical algorithms (e.g., probability values resulting from such processing).

In some examples, in addition to statistical models and/or neural networks, the language model may incorporate any suitable graphical model, e.g., a hidden Markov model (HMM) or a conditional random field (CRF). The graphical model may utilize statistical features (e.g., transition probabilities) and/or probability values to determine a probability of one or more words occurring next in a string, based on preceding words in the string. Accordingly, the graphical model may utilize the statistical features, and/or previously trained machine learning models to define transition probabilities between states represented in the graphical model.

When included, display subsystem 806 may be used to present a visual representation of data held by storage subsystem 804. This visual representation may take the form of a graphical user interface (GUI). Display subsystem 806 may include one or more display devices utilizing virtually any type of technology. In some implementations, display subsystem may include one or more virtual-, augmented-, or mixed reality displays.

When included, input subsystem 808 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 810 may be configured to communicatively couple computing system 800 with one or more other computing devices. Communication subsystem 810 may include wired and/or wireless communication devices compatible with one or more different communication protocols. The communication subsystem may be configured for communication via personal-, local- and/or wide-area networks.

The methods and processes disclosed herein may be configured to give users and/or any other humans control over any private and/or potentially sensitive data. Whenever data is stored, accessed, and/or processed, the data may be handled in accordance with privacy and/or security standards. When user data is collected, users or other stakeholders may designate how the data is to be used and/or stored. Whenever user data is collected for any purpose, the user data may only be collected with the utmost respect for user privacy (e.g., user data may be collected only when the user owning the data provides affirmative consent, and/or the user owning the data may be notified whenever the user data is collected). If the data is to be released for access by anyone other than the user or used for any decision-making process, the user's consent may be collected before using and/or releasing the data. Users may opt-in and/or opt-out of data collection at any time. After data has been collected, users may issue a command to delete the data, and/or restrict access to the data. All potentially sensitive data optionally may be encrypted and/or, when feasible, anonymized, to further protect user privacy. Users may designate portions of data, metadata, or statistics/results of processing data for release to other parties, e.g., for further processing. Data that is private and/or confidential may be kept completely private, e.g., only decrypted temporarily for processing, or only decrypted for processing on a user device and otherwise stored in encrypted form. Users may hold and control encryption keys for the encrypted data. Alternately or additionally, users may designate a trusted third party to hold and control encryption keys for the encrypted data, e.g., so as to provide access to the data to the user according to a suitable authentication protocol.

When the methods and processes described herein incorporate ML and/or AI components, the ML and/or AI components may make decisions based at least partially on training of the components with regard to training data. Accordingly, the ML and/or AI components may be trained on diverse, representative datasets that include sufficient relevant data for diverse users and/or populations of users. In particular, training data sets may be inclusive with regard to different human individuals and groups, so that as ML and/or AI components are trained, their performance is improved with regard to the user experience of the users and/or populations of users.

ML and/or AI components may additionally be trained to make decisions so as to minimize potential bias towards human individuals and/or groups. For example, when AI systems are used to assess any qualitative and/or quantitative information about human individuals or groups, they may be trained so as to be invariant to differences between the individuals or groups that are not intended to be measured by the qualitative and/or quantitative assessment, e.g., so that any decisions are not influenced in an unintended fashion by differences among individuals and groups.

ML and/or AI components may be designed to provide context as to how they operate, so that implementers of ML and/or AI systems can be accountable for decisions/assessments made by the systems. For example, ML and/or AI systems may be configured for replicable behavior, e.g., when they make pseudo-random decisions, random seeds may be used and recorded to enable replicating the decisions later. As another example, data used for training and/or testing ML and/or AI systems may be curated and maintained to facilitate future investigation of the behavior of the ML and/or AI systems with regard to the data. Furthermore, ML and/or AI systems may be continually monitored to identify potential bias, errors, and/or unintended outcomes.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

In an example, a method for text compression comprises: recognizing a prefix string of one or more text characters, the prefix string preceding a target string of a plurality of text characters to be compressed; providing the prefix string to a natural language generation (NLG) model configured to output one or more predicted continuations to the prefix string, each of the one or more predicted continuations having an associated rank; determining whether the one or more predicted continuations include a matching predicted continuation relative to a next one or more text characters of the target string; and if the one or more predicted continuations include the matching predicted continuation, compressing the next one or more characters of the target string as an NLG-type compressed representation that includes the associated rank of the matching predicted continuation; or if no predicted continuations of the one or more predicted continuations match the next one or more characters of the target string, identifying a longest matching entry in a compression dictionary that is consistent with the next one or more characters of the target string, each entry in the compression dictionary having a dictionary index value, and compressing the next one or more characters of the target string as a dictionary-type compressed representation that includes the dictionary index value of the longest matching entry. In this example or any other example, the method further comprises, after compressing the next one or more text characters of the target string as either the NLG-type compressed representation or the dictionary-type compressed representation, using some to all of the next one or more text characters of the target string as an updated prefix string for compressing a subsequent next one or more text characters of the target string. In this example or any other example, the method further comprises outputting a compressed target string, the compressed target string including a plurality of compressed representations corresponding to different text sequences in the target string, the plurality of compressed representations including both NLG-type compressed representations and dictionary-type compressed representations. In this example or any other example, each NLG-type compressed representation includes an indicator bit having a value indicating that the next one or more text characters of the target string are compressed as the associated rank of the matching predicted continuation, and each dictionary-type compressed representation includes the indicator bit having a different value indicating that the next one or more text characters of the target string are compressed as the dictionary index value of the longest matching entry. In this example or any other example, the one or more text characters of the prefix string have already been compressed, and the method further comprises concatenating the prefix string with the NLG-type compressed representation or the dictionary-type compressed representation. In this example or any other example, the compression dictionary is implemented via a Lempel-Ziv-Welch (LZW) text compression algorithm. In this example or any other example, the one or more predicted continuations to the prefix string is limited to a predetermined number of predicted continuations. In this example or any other example, the one or more predicted continuations to the prefix string is limited to any predicted continuations having associated probability values that exceed a probability threshold. In this example or any other example, a predicted continuation of the one or more predicted continuations includes one or more whole words predicted to follow the prefix string. In this example or any other example, the longest matching entry in the compression dictionary consistent with the next one or more text characters of the target string includes less than a next whole word of the target string. In this example or any other example, the method further comprises compressing any remaining text characters of the next whole word of the target string not matched by the longest matching entry via one or more additional dictionary-type compressed representations. In this example or any other example, the method further comprises adding a new entry to the compression dictionary, the new entry concatenating the longest matching entry with a first character of the next one or more text characters of the target string not matched by the longest matching entry. In this example or any other example, the method further comprises, prior to identifying the longest matching entry in the compression dictionary, adding one or more entries to the compression dictionary that match one or more prior target strings having previously been compressed based on predicted continuations output by the NLG model since a last time that the compression dictionary was updated. In this example or any other example, the prefix string and the next one or more text characters of the target string are separated by a word boundary. In this example or any other example, the associated rank of the matching predicted continuation is encoded using a prefix-free encoding system.

In an example, a method for text decompression comprises: recognizing a compressed representation that represents a next one or more text characters of a target string to be decompressed, the next one or more text characters of the target string preceded by a prefix string of one or more uncompressed text characters; determining whether an indicator bit of the compressed representation has a first value or a second value; and if the indicator bit has the first value: providing the prefix string to a natural language generation (NLG) model configured to output one or more predicted continuations to the prefix string, each of the one or more predicted continuations having an associated rank; identifying a matching predicted continuation having a matching associated rank that is consistent with the compressed representation; and outputting the matching predicted continuation as the next one or more text characters of the target string; or if the indicator bit has the second value: identifying a matching entry in a compression dictionary, the compression dictionary including a plurality of entries each having associated dictionary index values, the matching entry having a matching dictionary index value consistent with the compressed representation; and outputting the matching entry as the next one or more text characters of the target string; and concatenating the prefix string with the next one or more text characters of the target string. In this example or any other example, the compressed representation of the next one or more text characters of the target string was previously compressed by: providing the prefix string to the NLG model, the NLG model configured to output the one or more predicted continuations to the prefix string; determining whether the one or more predicted continuations include the matching predicted continuation relative to the next one or more text characters of the target string; and if the one or more predicted continuations include the matching predicted continuation, compressing the next one or more text characters of the target string as the matching associated rank of the matching predicted continuation, the matching associated rank preceded in the compressed representation by the indicator bit having the first value; or if no predicted continuations of the one or more predicted continuations match the next one or more text characters of the target string, identifying the matching entry in the compression dictionary as a longest matching entry consistent with the next one or more text characters of the target string, and compressing the next one or more text characters of the target string as the matching dictionary index value of the longest matching entry, the matching dictionary index value preceded in the compressed representation by the indicator bit having the second value. In this example or any other example, the compressed representation of the next one or more text characters of the target string is a portion of a compressed text string, the compressed text string including a plurality of different compressed representations corresponding to a plurality of different text sequences of the text string, and the method further comprises decompressing each of the plurality of compressed representations to recreate the text string. In this example or any other example, the one or more predicted continuations to the prefix string is limited to a predetermined number of predicted continuations.

In an example, a computing system comprises: a logic subsystem; and a storage subsystem holding instructions executable by the logic subsystem to: recognize a prefix string of one or more text characters, the prefix string preceding a target string of a plurality of text characters to be compressed; provide the prefix string to a natural language generation (NLG) model configured to output one or more predicted continuations to the prefix string, each of the one or more predicted continuations having an associated rank; determine whether the one or more predicted continuations include a matching predicted continuation relative to a next one or more text characters of the target string; and if the one or more predicted continuations include the matching predicted continuation, compress the next one or more text characters of the target string as an NLG-type compressed representation that includes the associated rank of the matching predicted continuation; or if no predicted continuations of the one or more predicted continuations match the next one or more text characters of the target string, identify a longest matching entry in a compression dictionary that is consistent with the next one or more text characters of the target string, each entry in the compression dictionary having a dictionary index value, and compress the next one or more text characters of the target string as a dictionary-type compressed representation that includes the dictionary index value of the longest matching entry.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for text compression, comprising:
    recognizing a prefix string of one or more text characters, the prefix string preceding a target string of a plurality of text characters to be compressed;
    providing the prefix string to a natural language generation (NLG) model configured to output one or more predicted continuations to the prefix string, each of the one or more predicted continuations having an associated rank;
    determining whether the one or more predicted continuations include a matching predicted continuation relative to a next one or more text characters of the target string; and
    if the one or more predicted continuations include the matching predicted continuation, compressing the next one or more characters of the target string as an NLG-type compressed representation that includes the associated rank of the matching predicted continuation; or
    if no predicted continuations of the one or more predicted continuations match the next one or more characters of the target string, identifying a longest matching entry in a compression dictionary that is consistent with the next one or more characters of the target string, each entry in the compression dictionary having a dictionary index value, and compressing the next one or more characters of the target string as a dictionary-type compressed representation that includes the dictionary index value of the longest matching entry.

2. The method of claim 1, further comprising, after compressing the next one or more text characters of the target string as either the NLG-type compressed representation or the dictionary-type compressed representation, using some to all of the next one or more text characters of the target string as an updated prefix string for compressing a subsequent next one or more text characters of the target string.

3. The method of claim 2, further comprising outputting a compressed target string, the compressed target string including a plurality of compressed representations corresponding to different text sequences in the target string, the plurality of compressed representations including both NLG-type compressed representations and dictionary-type compressed representations.

4. The method of claim 3, wherein each NLG-type compressed representation includes an indicator bit having a value indicating that the next one or more text characters of the target string are compressed as the associated rank of the matching predicted continuation, and each dictionary-type compressed representation includes the indicator bit having a different value indicating that the next one or more text characters of the target string are compressed as the dictionary index value of the longest matching entry.

5. The method of claim 1, wherein the one or more text characters of the prefix string have already been compressed, and the method further comprises concatenating the prefix string with the NLG-type compressed representation or the dictionary-type compressed representation.

6. The method of claim 1, wherein the compression dictionary is implemented via a Lempel-Ziv-Welch (LZW) text compression algorithm.

7. The method of claim 1, wherein the one or more predicted continuations to the prefix string is limited to a predetermined number of predicted continuations.

8. The method of claim 1, wherein the one or more predicted continuations to the prefix string is limited to any predicted continuations having associated probability values that exceed a probability threshold.

9. The method of claim 1, wherein a predicted continuation of the one or more predicted continuations includes one or more whole words predicted to follow the prefix string.

10. The method of claim 1, wherein the longest matching entry in the compression dictionary consistent with the next one or more text characters of the target string includes less than a next whole word of the target string.

11. The method of claim 10, further comprising compressing any remaining text characters of the next whole word of the target string not matched by the longest matching entry via one or more additional dictionary-type compressed representations.

12. The method of claim 10, further comprising adding a new entry to the compression dictionary, the new entry concatenating the longest matching entry with a first character of the next one or more text characters of the target string not matched by the longest matching entry.

13. The method of claim 1, further comprising, prior to identifying the longest matching entry in the compression dictionary, adding one or more entries to the compression dictionary that match one or more prior target strings having previously been compressed based on predicted continuations output by the NLG model since a last time that the compression dictionary was updated.

14. The method of claim 1, wherein the prefix string and the next one or more text characters of the target string are separated by a word boundary.

15. The method of claim 1, wherein the associated rank of the matching predicted continuation is encoded using a prefix-free encoding system.

16. A method for text decompression, comprising:
    recognizing a compressed representation that represents a next one or more text characters of a target string to be decompressed, the next one or more text characters of the target string preceded by a prefix string of one or more uncompressed text characters;
    determining whether an indicator bit of the compressed representation has a first value or a second value; and
    if the indicator bit has the first value:
        providing the prefix string to a natural language generation (NLG) model configured to output one or more predicted continuations to the prefix string, each of the one or more predicted continuations having an associated rank;

identifying a matching predicted continuation having a matching associated rank that is consistent with the compressed representation; and outputting the matching predicted continuation as the next one or more text characters of the target string; or if the indicator bit has the second value:

identifying a matching entry in a compression dictionary, the compression dictionary including a plurality of entries each having associated dictionary index values, the matching entry having a matching dictionary index value consistent with the compressed representation; and outputting the matching entry as the next one or more text characters of the target string; and concatenating the prefix string with the next one or more text characters of the target string.

17. The method of claim 16, wherein the compressed representation of the next one or more text characters of the target string was previously compressed by:

providing the prefix string to the NLG model, the NLG model configured to output the one or more predicted continuations to the prefix string;

determining whether the one or more predicted continuations include the matching predicted continuation relative to the next one or more text characters of the target string; and if the one or more predicted continuations include the matching predicted continuation, compressing the next one or more text characters of the target string as the matching associated rank of the matching predicted continuation, the matching associated rank preceded in the compressed representation by the indicator bit having the first value; or if no predicted continuations of the one or more predicted continuations match the next one or more text characters of the target string, identifying the matching entry in the compression dictionary as a longest matching entry consistent with the next one or more text characters of the target string, and compressing the next one or more text characters of the target string as the matching dictionary index value of the longest matching entry, the matching dictionary index value preceded in the compressed representation by the indicator bit having the second value.

18. The method of claim 16, wherein the compressed representation of the next one or more text characters of the target string is a portion of a compressed text string, the compressed text string including a plurality of different compressed representations corresponding to a plurality of different text sequences of the text string, and the method further comprises decompressing each of the plurality of compressed representations to recreate the text string.

19. The method of claim 16, wherein the one or more predicted continuations to the prefix string is limited to a predetermined number of predicted continuations.

20. A computing system, comprising:

a logic subsystem; and a storage subsystem holding instructions executable by the logic subsystem to:

recognize a prefix string of one or more text characters, the prefix string preceding a target string of a plurality of text characters to be compressed;

provide the prefix string to a natural language generation (NLG) model configured to output one or more predicted continuations to the prefix string, each of the one or more predicted continuations having an associated rank;

determine whether the one or more predicted continuations include a matching predicted continuation relative to a next one or more text characters of the target string; and if the one or more predicted continuations include the matching predicted continuation, compress the next one or more text characters of the target string as an NLG-type compressed representation that includes the associated rank of the matching predicted continuation; or if no predicted continuations of the one or more predicted continuations match the next one or more text characters of the target string, identify a longest matching entry in a compression dictionary that is consistent with the next one or more text characters of the target string, each entry in the compression dictionary having a dictionary index value, and compress the next one or more text characters of the target string as a dictionary-type compressed representation that includes the dictionary index value of the longest matching entry.

* * * * *